United States Patent
Jiang et al.

(10) Patent No.: US 10,319,742 B2
(45) Date of Patent: Jun. 11, 2019

(54) ARRAY SUBSTRATE, DISPLAY PANEL, DISPLAY DEVICE AND METHOD OF MANUFACTURING THE SAME

(71) Applicants: BOE Technology Group Co., Ltd., Beijing (CN); Hefei Xinsheng Optoelectronics Technology Co., Ltd., Hefei (CN)

(72) Inventors: Xuebing Jiang, Beijing (CN); Hui Wang, Beijing (CN); Jing Sun, Beijing (CN)

(73) Assignees: BOE TECHNOLOGY GROUP CO., LTD., Beijing (CN); HEFEI XINSHENG OPTOELECTRONICS TECHNOLOGY CO., LTD, Anhui (CN)

(*) Notice: Subject to any disclaimer, the term of this patent is extended or adjusted under 35 U.S.C. 154(b) by 0 days.

(21) Appl. No.: 15/680,817

(22) Filed: Aug. 18, 2017

(65) Prior Publication Data
US 2018/0188623 A1 Jul. 5, 2018

(30) Foreign Application Priority Data
Jan. 4, 2017 (CN) .......................... 2017 1 0003667

(51) Int. Cl.
*H01L 21/00* (2006.01)
*H01L 29/16* (2006.01)
(Continued)

(52) U.S. Cl.
CPC ........ *H01L 27/1214* (2013.01); *G02F 1/1362* (2013.01); *G02F 1/134363* (2013.01); *G02F 2001/134372* (2013.01)

(58) Field of Classification Search
CPC .................................................. H01L 27/1214
(Continued)

(56) References Cited

U.S. PATENT DOCUMENTS 6,057,896 A 5/2000 Rho et al.
6,243,146 B1 6/2001 Rho et al.
(Continued)

FOREIGN PATENT DOCUMENTS

CN 1183570 A 6/1998
CN 101201521 A 6/2008
(Continued)

OTHER PUBLICATIONS

First Office Action, including Search Report, for Chinese Patent Application No. 201710003667.0, dated Feb. 3, 2019, 25 pages.

*Primary Examiner* — Calvin Lee
(74) *Attorney, Agent, or Firm* — Westman, Champlin & Koehler, P.A.

(57) ABSTRACT

The disclosure relates to an array substrate, a display panel, a display device, and methods of manufacturing them. The array substrate includes: a base substrate, a first electrode, a first insulating layer, and a second electrode, the second electrode having a plurality of second electrode portions spaced apart from one another, the first electrode having overlapped portions that overlap the plurality of second electrode portions, the first electrode is one of a common electrode and a pixel electrode and the second electrode is the other; at least one of the second electrode and the overlapped portions has a recess recessing towards the base substrate and an area of an opening of the recess is larger than an area of a bottom of the recess.

19 Claims, 6 Drawing Sheets

(51) Int. Cl.
*H01L 27/12* (2006.01)
*G02F 1/1343* (2006.01)
*G02F 1/1362* (2006.01)

(58) Field of Classification Search
USPC .................. 257/83–85, 88; 438/28, 34, 43
See application file for complete search history.

(56) References Cited

U.S. PATENT DOCUMENTS

| | | | |
|---|---|---|---|
| 6,597,415 | B2 | 7/2003 | Rho et al. |
| 6,862,050 | B2 | 3/2005 | Rho et al. |
| 7,742,116 | B2 | 6/2010 | Cho et al. |
| 8,823,915 | B2 * | 9/2014 | Akai ................ G02F 1/1333 |
| | | | 349/138 |
| 9,246,084 | B2 * | 1/2016 | Lin .................. H01L 45/06 |
| | | | 257/536 |
| 9,653,680 | B2 * | 5/2017 | Pillarisetty ......... H01L 45/122 |
| 9,947,709 | B2 * | 4/2018 | Huang ............. H01L 23/5223 |
| 2001/0010567 | A1 | 8/2001 | Rho et al. |
| 2003/0179325 | A1 | 9/2003 | Rho et al. |
| 2008/0088788 | A1 | 4/2008 | Cho et al. |
| 2016/0380191 | A1 | 12/2016 | Pillarisetty et al. |

FOREIGN PATENT DOCUMENTS

| | | | |
|---|---|---|---|
| CN | 101290437 | A | 10/2008 |
| CN | 103928462 | A | 7/2014 |
| CN | 106249975 | A | 12/2016 |

* cited by examiner

ARRAY SUBSTRATE, DISPLAY PANEL, DISPLAY DEVICE AND METHOD OF MANUFACTURING THE SAME

CROSS-REFERENCE TO RELATED APPLICATION

The present application claims priority to Chinese Patent Application No. 201710003667.0, filed on Jan. 4, 2017, titled "array substrate, display panel and method of manufacturing the same", which is incorporated herein by reference in its entirety.

BACKGROUND

Field of the Disclosure

The disclosure relates to technical field of display, and particularly to an array substrate, a display panel, a display device, a method of manufacturing the array substrate and a method of manufacturing the display panel.

Description of the Related Art

A liquid crystal display device is a display device that is widely used. The liquid crystal display device mainly includes an array substrate and a color filter substrate arranged opposite to the array substrate. The liquid crystal display device generally includes a vertical electrical field type liquid crystal display device and a horizontal electrical field type liquid crystal display device. In the vertical electrical field type liquid crystal display device, a pixel electrode and a common electrode are disposed respectively on the array substrate and the color filter substrate. In the horizontal electrical field type liquid crystal display device, the pixel electrode and the common electrode are both disposed on the array substrate of the liquid crystal display device.

As for the horizontal electrical field type liquid crystal display device, the pixel electrode and the common electrode are located in different layers of the array substrate of the display device, and a fringe field capacitance and a storage capacitance are formed between the pixel electrode and the common electrode. The fringe field capacitance may provide a voltage for controlling deflection of liquid crystal molecules. The storage capacitance may reduce creepage of the fringe field capacitance to enhance ability of maintaining voltage of the pixel electrode.

SUMMARY

Embodiments of the present disclosure provide an array substrate, a display panel, a display device, a method of manufacturing the array substrate and a method of manufacturing the display panel, to solve at least problem in prior art that deflection of the liquid crystal is degraded due to reduced voltage of the storage capacitor between the common electrode and the pixel electrode.

According to an aspect of the disclosure, there is provided an array substrate. The array substrate includes: a base substrate, a first electrode on the base substrate, a first insulating layer over the first electrode, and a second electrode on the first insulating layer, the second electrode having a plurality of second electrode portions arranged along a plane parallel to a surface of the base substrate and spaced apart from one another, the first electrode having overlapped portions that overlap the plurality of second electrode portions in a direction perpendicular to the surface of the base substrate, wherein the first electrode is one of a common electrode and a pixel electrode and the second electrode is the other of the common electrode and the pixel electrode, and wherein at least one of the second electrode and the overlapped portions of the first electrode has a recess recessing towards the base substrate and an area of an opening of the recess is larger than an area of a bottom of the recess.

In an embodiment, the first electrode is the pixel electrode and the second electrode is the common electrode, and the array substrate further comprises: a second insulating layer between the base substrate and the pixel electrode.

In an embodiment, the recess comprises a first recess in the common electrode.

In an embodiment, the recess further comprises a second recess in the overlapped portion of the pixel electrode.

In an embodiment, the array substrate further comprises a thin film transistor, which comprises a passivation layer integrally formed with the first insulating layer, and a gate insulating layer integrally formed with the second insulating layer.

In an embodiment, the first electrode is the common electrode and the second electrode is the pixel electrode, the array substrate further comprises: a third insulating layer between the common electrode and the first insulating layer.

In an embodiment, the recess comprises a third recess in the pixel electrode.

In an embodiment, the array substrate further comprises a thin film transistor, which comprises a passivation layer integrally formed with the first insulating layer and a gate insulating layer integrally formed with the third insulating layer.

In an embodiment, a depth of the recess is not more than 500 nm and a ratio of each of the plurality of second electrode portions to a spacing between two adjacent second electrode portions is 3:5.

According to an aspect of the disclosure, there is provided a display panel comprising the above array substrate.

According to an aspect of the disclosure, there is provided a display device comprising the above display panel.

According to an aspect of the disclosure, there is provided a method of manufacturing an array substrate. The method includes: forming a first electrode on a base substrate; forming a first insulating layer over the first electrode; forming a second electrode on the first insulating layer, the second electrode having a plurality of second electrode portions arranged along a plane parallel to a surface of the base substrate and spaced apart from one another, the first electrode having overlapped portions that overlap the plurality of second electrode portions in a direction perpendicular to the surface of the base substrate, wherein the first electrode is one of a common electrode and a pixel electrode, and the second electrode is the other of the common electrode and the pixel electrode, and wherein the first electrode and the second electrode are configured such that at least one of the second electrode and the overlapped portions of the first electrode and has a recess recessing towards the base substrate and an area of an opening of the recess is larger than an area of a bottom of the recess.

In an embodiment, the first electrode is the pixel electrode and the second electrode is the common electrode, and wherein the forming the first electrode on the base substrate comprises: forming a second insulating material layer on the base substrate; patterning the second insulating material layer to form the second insulating layer having a first groove, the first groove overlapping the recess in the direction perpendicular to the surface of the base substrate; and forming the pixel electrode on the second insulating layer.

In an embodiment, the first electrode is the pixel electrode and the second electrode is the common electrode, and wherein the forming the first electrode on the base substrate comprises: forming a second insulating layer on the base substrate; and forming the pixel electrode on the second insulating layer, and wherein the forming the second electrode on the first insulating layer comprises: forming a first insulating layer material over the pixel electrode; and patterning the first insulating material layer to form the first insulating layer having a second groove, the second groove overlapping the recess in the direction perpendicular to the surface of the base substrate.

In an embodiment, the first insulating layer and a passivation layer of a thin film transistor of the array substrate are integrally formed and the second insulating layer and a gate insulating layer of the thin film transistor are integrally formed.

In an embodiment, the first electrode is the common electrode and the second electrode is the pixel electrode, and wherein the forming the first insulating layer over the common electrode comprises: forming a third insulating layer over the common electrode; forming a first insulating material layer on the third insulating layer; and etching the first insulating material layer to form the first insulating layer having a third groove such that the third groove overlaps the recess in a direction perpendicular to the surface of the base substrate.

In an embodiment, the first insulating layer and a passivation layer of a thin film transistor of the array substrate are integrally formed and the third insulating layer and a gate insulating layer of the thin film transistor are integrally formed.

In an embodiment, a depth of the recess is not more than 500 nm and a ratio of each of the plurality of second electrode portions to a spacing between two adjacent second electrode portions is 3:5.

According to an aspect of the disclosure, there is provided a method of manufacturing a display panel. The method includes the above method of manufacturing the array substrate.

BRIEF DESCRIPTION OF THE DRAWINGS

In order to illustrate the technical schemes of the embodiments of the present disclosure more clearly, drawings of the embodiments are described as below. It is noted that the following illustrated drawings merely relate to some of the embodiments of the present disclosure, rather than limiting the present disclosure. In the drawings.

DETAILED DESCRIPTION OF PREFERRED EMBODIMENTS

Figure 1:
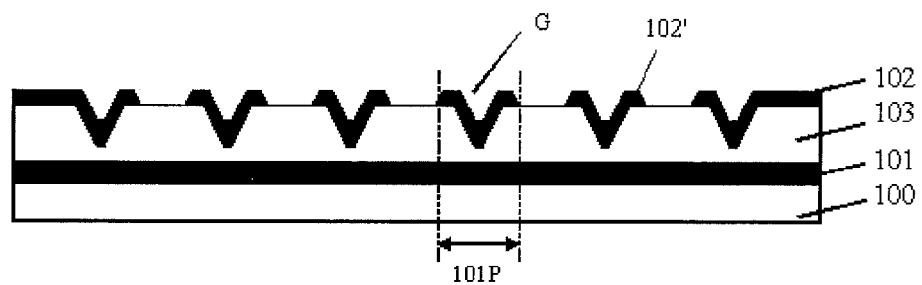
FIG. 1 is a schematic cross sectional view of an array substrate according to an embodiment of the present disclosure.

In order to make the objects, technical schemes and advantages of the embodiments of the present disclosure more clearly, technical solutions of the embodiments of the present disclosure are described in detail in conjunction with the drawings. Obviously, the described embodiments are merely a part, rather than all, of the embodiments of the present disclosure. Based on the disclosed embodiments, other embodiments that can be obtained by those skilled in the art without inventive labor belong to the scope of the present disclosure.

Unless definitely indication in the context, a term in singular formation used in the description and claims would include its plural concept, and vice versa. Similarly, phases "include" and "comprise" are interpreted to be inclusive but not exclusive. Similarly, terms "include" and "or" should be understood to be inclusive, unless it is forbidden to be interpreted as such herein. When the term "embodiment" is used in the context, particularly after a group of terms, the "embodiment" is merely illustrative and descriptive, instead of being interpreted as be exclusive or general.

For purpose of description in the context, as denoted in the drawings, terms of "up", "down", "right", "left", "vertical", "horizontal", "top", "bottom" and their derivatives shall relate to the disclosure. Terms of "over", "at top of", "located on" or "located over" mean a first element such as a first structure lies on a second element such as second structure, wherein a medium element such as an interface structure may be provided between the first element and the second element. Term of "contact" means the first element such as the first structure is connected to the second element such as the second structure and an or no other element may be provided at the interface between the two elements.

An embodiment of the present disclosure provides an array substrate. The array substrate includes a base substrate, a first electrode on the base substrate, a first insulating layer on the first electrode, and a second electrode on the first insulating layer, the second electrode having a plurality of second electrode portions arranged in a direction parallel to a surface of the base substrate and spaced apart from one another and the first electrode having overlapped portions that overlap the plurality of second electrode portions in a direction perpendicular to the surface of the base substrate, the first electrode is one of a common electrode and a pixel electrode and the second electrode is the other of them, and at least one of the second electrode and the overlapped portions of the first electrode has a recess recessing towards the base substrate and an area of an opening of the recess is larger than an area of a bottom of the recess.

FIG. 1 is a cross sectional view of an array substrate according to an embodiment of the present disclosure. As shown in FIG. 1, the array substrate according to the embodiment includes a base substrate 100, a first electrode 101 located on the base substrate 100, a first insulating layer 103 located over the first electrode 101 and a second electrode 102 located on the first insulating layer 103. It can be seen from FIG. 1 that the second electrode 102 is configured to be parallel to a surface of the base substrate 100. As shown in FIG. 1, the second electrode includes a plurality of second electrode portions 102' which are spaced apart from one another. The first electrode 101 has overlapped portions 101P that overlap the plurality of second electrode portions in a direction perpendicular to the surface of the base substrate 100. The first electrode 101 may be one of a common electrode and a pixel electrode and the second electrode 102 may be the other of them.

In the embodiment as shown in FIG. 1, the second electrode 102 has recesses G recessing towards the base substrate while the overlapped portion 101P of the first electrode 101 does not have any recess recessing towards the base substrate. However, the configuration as shown in FIG. 1 is only exemplary; it is also the case as long as at least one of the second electrode 102 and the overlapped portion 101P has the recess. It can be seen from FIG. 1 that an area of an opening of the recess G of the second electrode 102 is larger than an area of a bottom of the recess. The recesses G as shown in FIG. 1 each have a cross section in a V shape. It is appreciated that the cross section of each of the recesses G may be in a shape of U or other shapes. It is noted that the shape and depth of each of the recesses are not particularly limited and may be set according to actual requirements.

Figure 2:
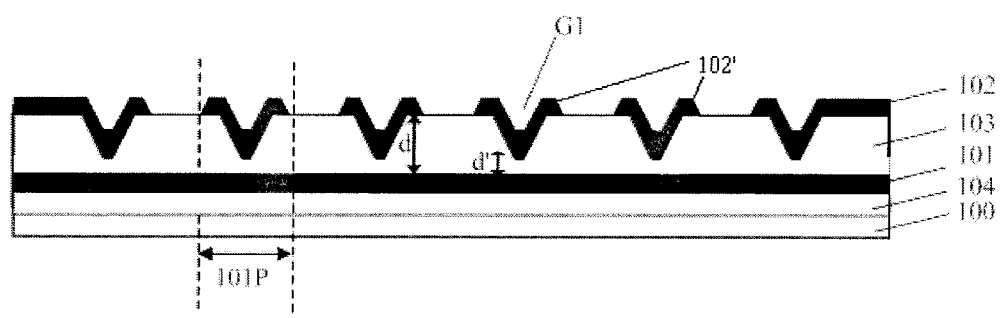
FIG. 2 is a schematic cross sectional view of an array substrate according to an embodiment of the present disclosure.

FIG. 2 is a cross sectional view of an array substrate according to an embodiment of the present disclosure. FIG. 2 shows an example in which the first electrode 101 is a pixel electrode and the second electrode 102 is a common electrode. As shown in FIG. 2, the array substrate may further include a second insulating layer 104 between the base substrate 100 and the first electrode 101 (i.e., the pixel electrode). In the embodiment as shown in FIG. 2, the recesses are illustrated by an example of first recesses G1 in the second electrode 102 (i.e., the common electrode).

Figure 3:
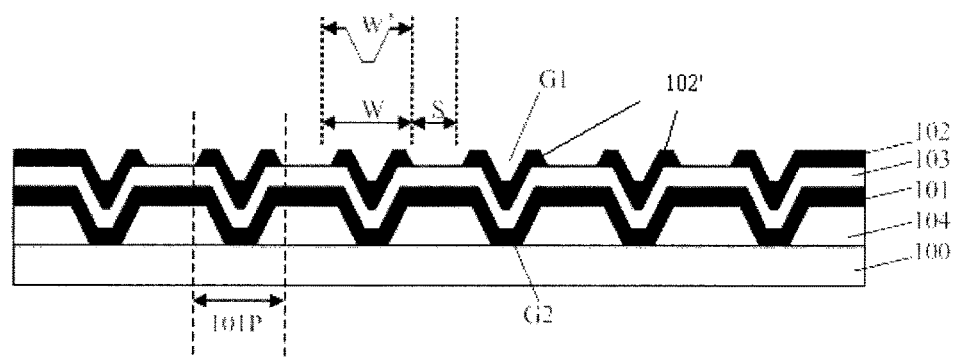
FIG. 3 is a schematic cross sectional view of an array substrate according to an embodiment of the present disclosure.

In FIG. 2, d is provided to represent a distance between the first electrode and the second electrode in a situation where the second electrode 102 has no recess and d' is provided to represent an equivalent distance between the first electrode 101 and the second electrode 102 in a situation where the second electrode 102 has the recesses. It can be seen that the equivalent distance d' between the first electrode 101 and the second electrode 102 in the situation where the recesses are provided is less than the distance d between the first electrode 101 and the second electrode 102 in the situation where no recess is provided. Thus, formation of the recesses may reduce the distance between the first electrode 101 and the second electrode 102 and thus may increase a storage capacitance between the first electrode 101 and the second electrode 102. Meanwhile, it is avoided that the light transmission is reduced by increasing a ratio of an area of a portion of the second electrode covering on the layer 103 to an area of a portion of the layer 103 that is not covered by the second electrode in order to increase the storage capacitance when a flat electrode is used. FIG. 3 shows an embodiment, in which W and S are illustrated as a length of the recess and a spacing between two recesses. From FIG. 3, W/S represents a ratio that is related to the light transmission, i.e., the larger the W/S is, the larger an area of the covering portion of the second electrode is and the smaller the light transmission is.

FIG. 3 is a cross sectional view of an array substrate according to an embodiment of the present disclosure. FIG. 3 also shows an example in which the first electrode 101 is a pixel electrode and the second electrode 102 is a common electrode. In the embodiment as shown in FIG. 3, not only the second electrode 102 (i.e., the common electrode) has recesses, but also the overlapped portions 101P of the first electrode 101 (i.e., pixel electrode) have recesses. It can be seen from FIG. 3 that first recesses G1 are provided in the second electrode 102 (i.e., the common electrode), i.e., specifically the first recesses G1 are each provided in the second electrode portion 102' and second recesses G2 are provided in the first electrode 101 (i.e., pixel electrode). In the array substrate shown in FIG. 3, a bottom of each of the second recesses G2 in the first electrode 101 reaches a bottom surface of the second insulating layer 104. However, it is noted that the configuration shown in FIG. 3 is merely an example, instead of limiting the depth of the second recesses. The depth of the second recesses may be set by those skilled in the art as required. Similarly, the depth of the first recesses G1 in the second electrode 102 may also be set by those skilled in the art as required.

In FIG. 3, W is indicative of a length of the second electrode portion 102' when provided with no recess, W' is indicative of a length of the second electrode portion 102' when provided with the first recess G1 and S is indicative of a spacing between two adjacent second electrode portions 102'. It is seen that the length W' of the second electrode portion 102' when provided with the recess is larger than the length W of the second electrode portion 102 when provided with no recess. Thus, due to the recesses in all of the overlapped portions of the first electrode and in the second electrode, a longitudinal overlapping area between the first electrode 101 and the second electrode 102 may be increased. With relative to the structure as shown in FIG. 2, the structure as shown in FIG. 3 may render further increased capacitance between the first electrode 101 and the second electrode 102 while no increase of a value of W/S, thereby avoiding decrease of the light transmission due to increasing the value of W/S in order to increase the storage capacitance when a flat electrode is used.

In an embodiment, the depth of the recess may be not more than 500 nm and the ratio of the length W of the second electrode portion 102' to the spacing S between two adjacent second electrode portions 102' may be ⅗.

Figure 4:
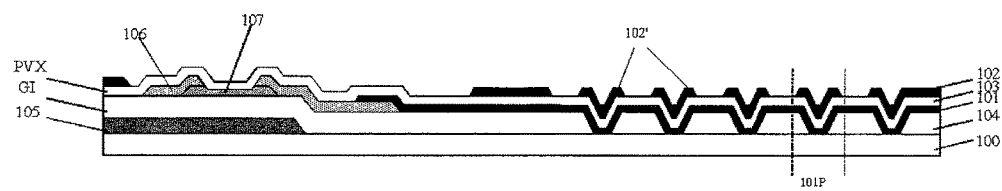
FIG. 4 is a schematic view of an array substrate according to an embodiment of the present disclosure.

FIG. 4 is a schematic view of an array substrate according to an embodiment of the present disclosure. With relative to the structure as shown in FIGS. 1-3, FIG. 4 further illustrates a thin film transistor region of the array substrate at the left region. As shown in FIG. 4, the thin film transistor region of the array substrate includes a gate metal layer 105, a gate insulating layer GI over the gate metal layer 105, an active layer 107 over the gate insulating layer GI, a source/drain electrode layer 106 over the active layer 107 and a passivation layer 107 over the source/drain electrode layer 106. It can be seen that, in the embodiment as shown in FIG. 4, the passivation layer PVX of the thin film transistor of the array substrate and the first insulating layer 103 may be integrally formed, and the gate insulating layer GI of the thin film transistor and the second insulating layer 104 may be integrally formed.

Figure 5:
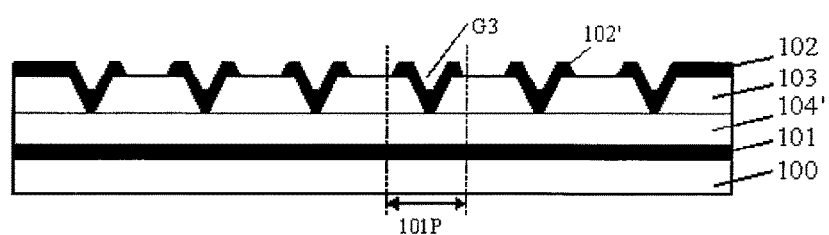
FIG. 5 is a schematic view of an array substrate according to an embodiment of the present disclosure.

FIG. 5 is a schematic view of an array substrate according to an embodiment of the present disclosure. FIG. 5 illustrates an example where the first electrode 101 is a common electrode and the second electrode 102 is a pixel electrode. As shown in FIG. 5, the array substrate may further include a third insulating layer 104' between the first electrode 101 (i.e., common electrode) and first insulating layer 103. The recess may include a third recess G3 in the second electrode (i.e., pixel electrode). The overlapped portions 101P of the first electrode 101 (i.e., the common electrode) may not include recess. It is noted that, in the array substrate as shown in FIG. 5, a bottom of the third recess G3 in the second electrode 102 reaches a bottom surface of the first insulating layer 103, and however, the configuration of the third recess G3 as shown in FIG. 5 is merely exemplary, instead of limitation of the depth of the third recess. The depth of the third recess may be set as required.

Figure 6:
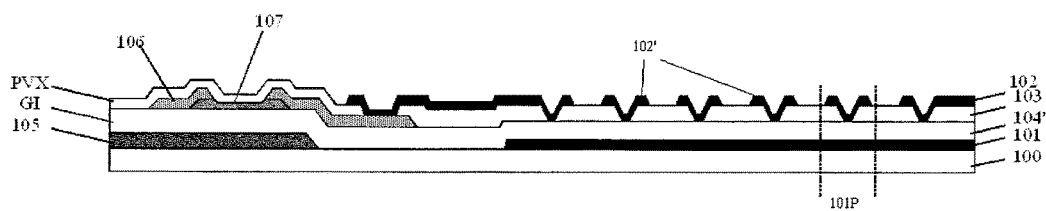
FIG. 6 is a schematic view of an array substrate according to an embodiment of the present disclosure.

FIG. 6 is a schematic view of an array substrate according to an embodiment of the present disclosure. FIG. 6 illustrates a thin film transistor region of the array substrate at the left region. As shown in FIG. 6, the thin film transistor region of the array substrate includes a gate metal layer 105, a gate insulating layer GI over the gate metal layer 105, an active layer 107 on the gate insulating layer GI, a source/drain electrode layer 106 on the active layer 107 and a passivation layer 107 over the source/drain electrode layer 106. It can be seen that, in the embodiment as shown in FIG. 6, the passivation layer PVX of the thin film transistor of the array substrate and the first insulating layer 103 may be integrally formed, and the gate insulating layer GI of the thin film transistor and the second insulating layer 104' may be integrally formed.

An embodiment of the present disclosure further discloses a display panel including the above array substrate.

A further embodiment of the present disclosure discloses a display device including the above display panel.

Another embodiment of the present disclosure provides a method of manufacturing an array substrate.

Figure 7:
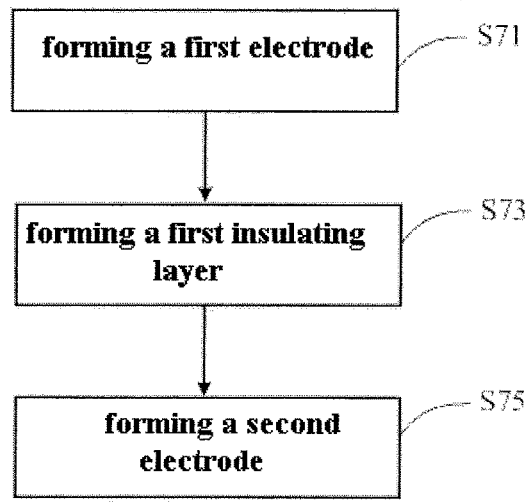
FIG. 7 is a flow chart of a method of manufacturing an array substrate according to an embodiment of the present disclosure.

FIG. 7 illustrate a flow chart of a method of manufacturing an array substrate according to an embodiment of the present disclosure. As shown in FIG. 7, the method includes steps of:

S1, forming a first electrode on a base substrate;

S3, forming a first insulating layer over the first electrode;

S5, forming a plurality of second electrode portions 102' on the first insulating layer, such that the second electrode portions 102' are arranged along a plane parallel to a surface of the base substrate and spaced apart from one another; and wherein, the first electrode is one of a common electrode and a pixel electrode, and the second electrode is the other of them, the first electrode has overlapped portions that overlap the plurality of second electrode portions in a direction perpendicular to the surface of the base substrate, and the first electrode and the second electrode are configured such that at least one of the second electrode and the overlapped portions of the first electrode has recesses recessing towards the base substrate and an area of an opening of each of the recesses is larger than an area of a bottom of the same. The recesses G as shown in FIGS. 1~6 in the present disclosure have a cross section in a shape of V. However, it is appreciated that the cross section of the recesses G may be in a shape of U or other shape. It is noted that the shape and depth of the recesses in the present disclosure are not specifically defined and may be set as required.

Figure 8:
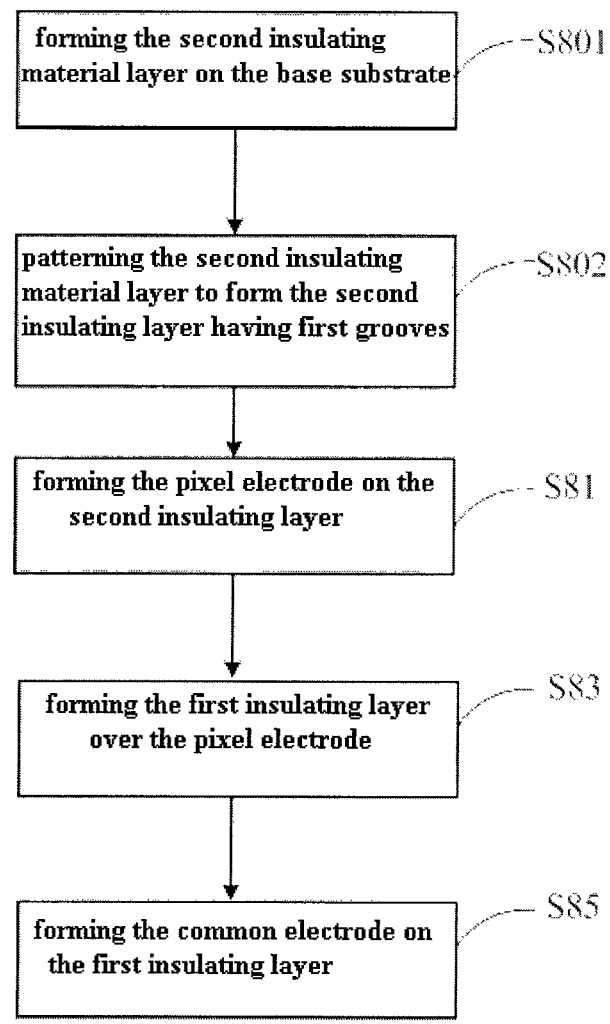
FIG. 8 is a flow chart of a method of manufacturing an array substrate according to an embodiment of the present disclosure.

FIG. 8 is a flow chart of a method of manufacturing an array substrate according to an embodiment of the present disclosure. FIG. 8 shows an example where the first electrode is a pixel electrode and the second electrode is a common electrode. In the embodiment as shown in FIG. 8, the forming the first electrode on the base substrate includes: forming a second insulating material layer over the base substrate; patterning the second insulating material layer to form the second insulating layer having first grooves, the first grooves overlapping the recesses in the direction perpendicular to the surface of the base substrate; and, providing the pixel electrode on the second insulating layer. It can be seen that, in the embodiment as shown in FIG. 8, the method of manufacturing the array substrate may specifically include the steps of:

S801, forming the second insulating material layer on the base substrate;

S802, patterning the second insulating material layer to form the second insulating layer having first grooves, the first grooves overlapping the recesses in the direction perpendicular to the surface of the base substrate;

S81, forming the pixel electrode on the second insulating layer;

S83, forming the first insulating layer over the pixel electrode; and

S85, forming the common electrode on the first insulating layer.

Figure 9:
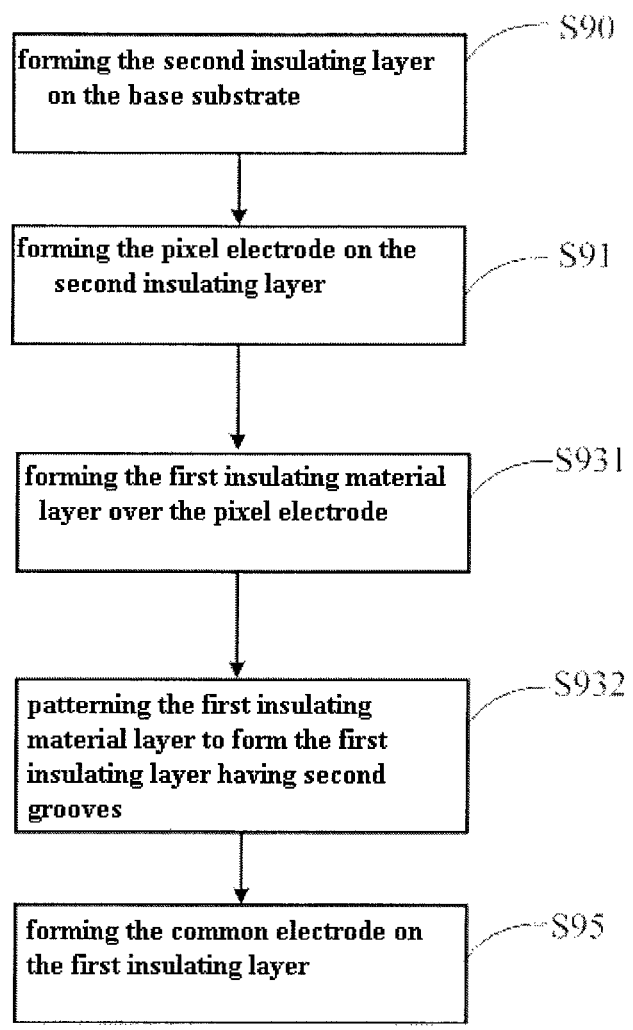
FIG. 9 is a flow chart of a method of manufacturing an array substrate according to an embodiment of the present disclosure.

FIG. 9 is a flow chart of a method of manufacturing the array substrate according to an embodiment of the present disclosure. FIG. 9 shows an example where the first electrode is a pixel electrode and the second electrode is a common electrode. In the embodiment as shown in FIG. 9, the forming the first electrode on the base substrate includes: forming the second insulating layer over the base substrate; and forming the pixel electrode on the second insulating layer; and the forming the second electrode on the first insulating layer includes: forming a first insulating material layer on the pixel electrode; and patterning the first insulating material layer to form the first insulating layer having second grooves, the second grooves overlapping the recesses in the direction perpendicular to the surface of the base substrate. It can be seen that, in the embodiment as shown in FIG. 9, the method of manufacturing the array substrate specifically includes the steps of:

S90, forming the second insulating layer on the base substrate;

S91, forming the pixel electrode on the second insulating layer;

S931, forming the first insulating material layer over the pixel electrode;

S932, patterning the first insulating material layer to form the first insulating layer having second grooves, the second grooves overlapping the recesses respectively in the direction perpendicular to the surface of the base substrate; and S95, forming the common electrode on the first insulating layer.

In an embodiment, the first insulating layer may be formed integrally with the passivation layer of the thin film transistor of the array substrate and the second insulating layer may be formed integrally with the gate insulating layer of the thin film transistor of the array substrate.

Figure 10:
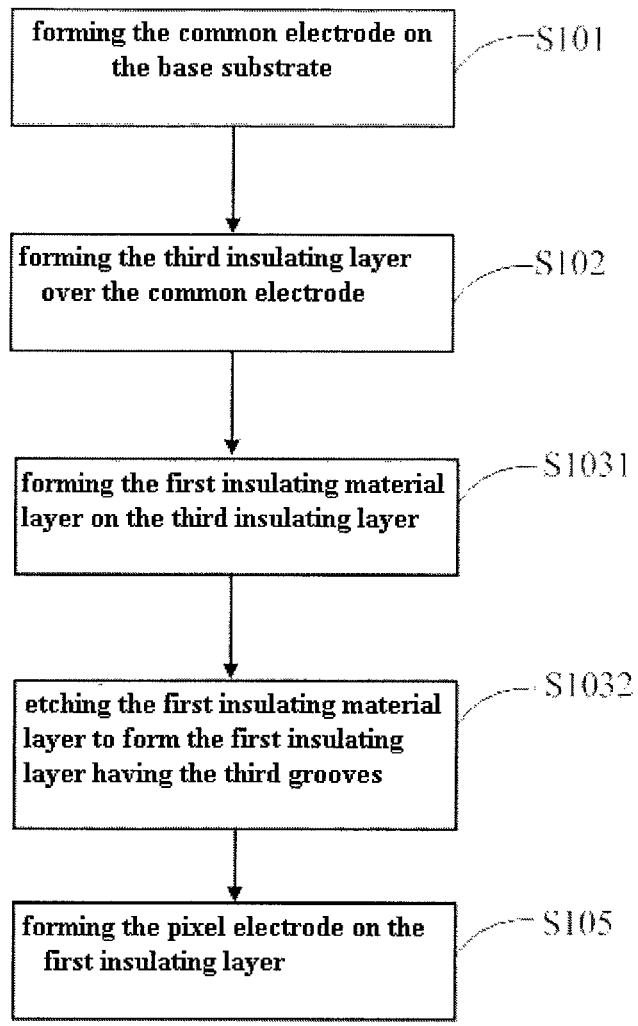
FIG. 10 is a flow chart of a method of manufacturing an array substrate according to an embodiment of the present disclosure.

FIG. 10 is a flow chart of a method of manufacturing the array substrate according to an embodiment of the present disclosure. FIG. 10 shows an example where the first electrode is a common electrode and the second electrode is a pixel electrode. In the embodiment as shown in FIG. 10, the forming the first insulating layer over the common electrode includes: forming a third insulating layer over the common electrode; forming a first insulating material layer on the third insulating layer; and etching the first insulating material layer to form the first insulating layer having the third grooves, the third grooves overlapping respectively the recesses in the direction perpendicular to the surface of the base substrate. In the embodiment as shown in FIG. 10, the method of manufacturing the array substrate may specifically include the steps of:

S101, forming the common electrode on the base substrate;

S102, forming the third insulating layer over the common electrode;

S1031, forming the first insulating material layer on the third insulating layer;

S1032, etching the first insulating material layer to form the first insulating layer having the third grooves, the third grooves overlapping the recesses in the direction perpendicular to the surface of the base substrate; and S105, forming the pixel electrode on the first insulating layer.

In an embodiment, the first insulating layer may be formed integrally with the passivation layer of the thin film transistor of the array substrate and the third insulating layer may be formed integrally with the gate insulating layer of the thin film transistor of the array substrate.

In an embodiment, the depth of the recesses may be not more than 500 nm and the ratio of the length of the second electrode portion 102' to the spacing between two adjacent second electrode portions may be 3:5. The first electrode and the second electrode may be made of transparent conductive materials such as indium tin oxide (ITO), graphene, and may be also made of other suitable materials.

Embodiments of the present disclosure further provide a display panel, a display device and a method of manufacturing the display panel. The display panel in the embodiment of the present disclosure includes the above described array substrate. The display device in the embodiment of the present disclosure may be a mobile phone, a tablet computer, a television, a note computer, a digital photo frame, a navigator or any product or component having display function.

Figure 11:
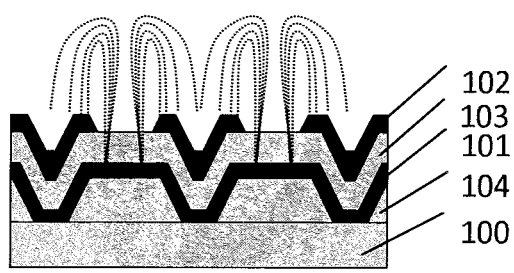
FIG. 11 is a schematic view of a fringe electrical field of an array substrate according to an embodiment of the present disclosure.

FIG. 11 illustrates a schematic view of a fringe electrical field of the array substrate according to an embodiment of the present disclosure. In the display device including the array substrate according to the present disclosure, deflection of the liquid crystal molecule is controlled by the fringe electrical field formed between the first electrode 101 and the second electrode 102. The storage capacitance between the first electrode 101 and the second electrode 102 may be increased by reducing a distance between the first electrode 101 and the second electrode 102 and/or by increasing an overlapping area between the first electrode 101 and the second electrode 102 in a longitudinal direction, and thus the fringe electrical field caused by the storage capacitance may be increased to control the deflection of the liquid crystal better while no influence is impacted on the light transmission of the display device.

In the array substrate, the display panel, the display device, the method of manufacturing the array substrate and the method of manufacturing the display panel provided according to embodiments of the present disclosure, the first electrode is formed on the base substrate, the first insulating layer is formed over the first electrode, the second electrode is formed on the first insulating layer such that the second electrode has a plurality of second electrode portions arranged along a plane parallel to a surface of the base substrate and spaced apart from one another, the first electrode is configured as one of the common electrode and the pixel electrode and the second electrode is configured as the other of the common electrode and the pixel electrode, and the first electrode has overlapped portions that overlap the plurality of second electrode portions in a direction perpendicular to the surface of the base substrate; the second electrode and the first electrode are configured such that at least one of the second electrode and the overlapped portions of the first electrode and has recesses recessing towards the base substrate and an area of an opening of each of the recesses is larger than an area of a bottom of the same, thereby increasing the storage capacitance between the first electrode and the second electrode and avoiding problem of reduction of the light transmission due to increasing the storage capacitance in the situation where a flat electrode is used.

Specific embodiments have been described and illustrated in manner of examples, and are not intended to limit the scope of the present disclosure. In fact, the inventive embodiments as described herein may be implemented in other manners. In addition, various omitting, replacements and changes may be made to the embodiments described above without departing from inspirit of the present disclosure. The claims and their equivalents are intended to cover these formations or modifications within the scope and inspirit of the present disclosure.

What is claimed are:

1. A method of manufacturing an array substrate, the method comprising:
    forming a first electrode on a base substrate;
    forming a first insulating layer over the first electrode; and
    forming a second electrode on the first insulating layer, the second electrode having a plurality of second electrode portions arranged along a plane parallel to a surface of the base substrate and spaced apart from one another, the first electrode having overlapped portions that overlap the plurality of second electrode portions in a direction perpendicular to the surface of the base substrate;
    wherein the first electrode is one of a common electrode and a pixel electrode, and the second electrode is the other of the common electrode and the pixel electrode,
    wherein the plurality of second electrode portions comprises a first second electrode portion and a second second electrode portion adjacent to each other and spaced apart by one separation, and the first electrode comprises a first overlapped portion and a second overlapped portion, the first overlapped portion overlapping the first second electrode portion in the direction perpendicular to the surface of the base substrate, the second overlapped portion overlapping the second second electrode portion in the direction perpendicular to the surface of the base substrate, and
    wherein both of the first second electrode portion and the second second electrode portion and/or both of the first overlapped portion and the second overlapped portion have recesses, each of the recess is recessed towards the base substrate and an area of an opening of the recess is larger than an area of a bottom of the recess.

2. The method according to claim 1, wherein the first electrode is the pixel electrode and the second electrode is the common electrode, and wherein the forming the first electrode on the base substrate comprises:
    forming a second insulating layer on the base substrate; and
    forming the pixel electrode on the second insulating layer, and wherein the forming the second electrode on the first insulating layer comprises:
    forming a first insulating layer material over the pixel electrode; and
    patterning the first insulating material layer to form the first insulating layer having a second groove, the second groove overlapping the recess in the direction perpendicular to the surface of the base substrate.

3. The method according to claim 1, wherein the first electrode is the pixel electrode and the second electrode is the common electrode, and wherein the forming the first electrode on the base substrate comprises:

forming a second insulating material layer on the base substrate;

patterning the second insulating material layer to form the second insulating layer having a first groove, the first groove overlapping the recess in the direction perpendicular to the surface of the base substrate; and forming the pixel electrode on the second insulating layer.

4. The method according to claim 1, wherein the first insulating layer and a passivation layer of a thin film transistor of the array substrate are integrally formed and the second insulating layer and a gate insulating layer of the thin film transistor are integrally formed.

5. The method according to claim 1, wherein a depth of the recess is not more than 500 nm and a ratio of each of the plurality of second electrode portions to a spacing between two adjacent second electrode portions is 3:5.

6. A method of manufacturing a display panel, the method comprising the method according to claim 1.

7. The method according to claim 1, wherein the first electrode is the common electrode and the second electrode is the pixel electrode, and wherein the forming the first insulating layer over the common electrode comprises:

forming a third insulating layer over the common electrode;

forming a first insulating material layer on the third insulating layer; and etching the first insulating material layer to form the first insulating layer having a third groove such that the third groove overlaps the recess in a direction perpendicular to the surface of the base substrate.

8. The method according to claim 7, wherein the first insulating layer and a passivation layer of a thin film transistor of the array substrate are integrally formed and the third insulating layer and a gate insulating layer of the thin film transistor are integrally formed.

9. An array substrate comprising: a base substrate, a first electrode on the base substrate, a first insulating layer over the first electrode, and a second electrode on the first insulating layer, the second electrode having a plurality of second electrode portions arranged along a plane parallel to a surface of the base substrate and spaced apart from one another, the first electrode having overlapped portions that overlap the plurality of second electrode portions in a direction perpendicular to the surface of the base substrate respectively, wherein the first electrode is one of a common electrode and a pixel electrode and the second electrode is the other of the common electrode and the pixel electrode;

wherein the plurality of second electrode portions comprises a first second electrode portion and a second second electrode portion adjacent to each other and spaced apart by one separation, and the first electrode comprises a first overlapped portion and a second overlapped portion, the first overlapped portion overlapping the first second electrode portion in the direction perpendicular to the surface of the base substrate, the second overlapped portion overlapping the second second electrode portion in the direction perpendicular to the surface of the base substrate; and wherein both of the first second electrode portion and the second second electrode portion and/or both of the first overlapped portion and the second overlapped portion have recesses, each of the recess is recessed towards the base substrate and an area of an opening of the recess is larger than an area of a bottom of the recess.

10. The array substrate according to claim 9, wherein a depth of the recess is not more than 500 nm and a ratio of each of the plurality of second electrode portions to a spacing between two adjacent second electrode portions is 3:5.

11. A display panel comprising the array substrate according to claim 9.

12. A display device comprising the display panel according to claim 11.

13. The array substrate according to claim 9, wherein the first electrode is the common electrode and the second electrode is the pixel electrode, and the array substrate further comprises: a third insulating layer between the common electrode and the first insulating layer.

14. The array substrate according to claim 13, wherein the array substrate further comprises a thin film transistor, which comprises a passivation layer integrally formed with the first insulating layer and a gate insulating layer integrally formed with the third insulating layer.

15. The array substrate according to claim 13, wherein the recess comprises a third recess in the pixel electrode.

16. The array substrate according to claim 9, wherein the first electrode is the pixel electrode and the second electrode is the common electrode, and the array substrate further comprises: a second insulating layer between the base substrate and the pixel electrode.

17. The array substrate according to claim 16, wherein the array substrate further comprises a thin film transistor, which comprises a passivation layer integrally formed with the first insulating layer, and a gate insulating layer integrally formed with the second insulating layer.

18. The array substrate according to claim 16, wherein the recess comprises a first recess in the common electrode.

19. The array substrate according to claim 18, wherein the recess further comprises a second recess in the overlapped portion of the pixel electrode.

* * * * *